US006833801B1

United States Patent
Ostrem et al.

(10) Patent No.: US 6,833,801 B1
(45) Date of Patent: Dec. 21, 2004

(54) LOW DISTORTION CURRENT SWITCHES FOR HIGH SPEED CURRENT STEERING DIGITAL-TO-ANALOG CONVERTERS

(75) Inventors: Geir Sigurd Ostrem, Colorado Springs, CO (US); Paul W. Kalthoff, Colorado Springs, CO (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/724,645

(22) Filed: Dec. 1, 2003

(51) Int. Cl.$^7$ .............................................. H03M 1/66
(52) U.S. Cl. ...................................... 341/144; 341/136
(58) Field of Search ................................ 341/144, 136, 341/153, 145; 327/266, 95, 280

(56) References Cited

U.S. PATENT DOCUMENTS

| | | | | | |
|---|---|---|---|---|---|
| 5,528,186 | A | * | 6/1996 | Imamura | 327/266 |
| 5,548,288 | A | * | 8/1996 | Lueng | 341/136 |
| 5,793,231 | A | * | 8/1998 | Whittaker | 327/95 |
| 6,339,391 | B1 | * | 1/2002 | Chung et al. | 341/153 |
| 6,525,586 | B1 | * | 2/2003 | Ahmed et al. | 327/280 |
| 6,583,744 | B2 | * | 6/2003 | Bright | 341/145 |
| 6,621,432 | B1 | * | 9/2003 | Ganci | 341/136 |
| 6,664,909 | B1 | * | 12/2003 | Hyde et al. | 341/144 |
| 6,703,956 | B1 | * | 3/2004 | Mueller et al. | 341/145 |

OTHER PUBLICATIONS

W. Schofield et al., "A 16b 400MS/s DAC with <–80dBc IMD to 300 MHz and <–160dBm/Hz Noise Power Spectral Density", IEEE International Solid–State Circuits Conference, 2003, Session 7, DACs and AMPs, Paper 7.1.

* cited by examiner

Primary Examiner—Jean Bruner Jeanglaude
(74) Attorney, Agent, or Firm—Blakely, Sokoloff, Taylor & Zafman LLP

(57) ABSTRACT

Low distortion current switches for high speed current steering digital-to-analog converters. The current switches use a compensation method for improving the spurious peformance of a CMOS current steering DAC for high output frequencies caused by the capacitance of the common node of the switch transistors. For this purpose, a replica switch is provided, with the voltage change on the common node of the replica switch being used to provide a corresponding charge to the common node of the main switch in an amount equal to the charge needed to change the voltage on the common node of the main switch by the same amount as the voltage change on the common node of the replica switch. Multiple embodiments are disclosed.

29 Claims, 4 Drawing Sheets

LOW DISTORTION CURRENT SWITCHES FOR HIGH SPEED CURRENT STEERING DIGITAL-TO-ANALOG CONVERTERS

BACKGROUND OF THE INVENTION

1. Field of the Invention

The present invention relates to current steering digital to analog converters (DACs).

2. Prior Art

A thermometer-coded DAC consists of a large number of equal value current sources. These are each switched between the two DAC outputs using differential pairs, as shown in FIG. 1. The differential pair transistors $M_1$ and $M_2$ are operated in saturation, and each have a voltage gain equal to $G_{SW}=g_m/g_{ds}$ when on. At any one time, one of these transistors is on, and the other is off.

There is a parasitic capacitance $C_S$ associated with the common source node of each differential pair. The potential on the common source node of the differential pair can be called $V_{CS}$. The output of the DAC has a common mode voltage $V_{CM}$ and a differential voltage $V_O$. When the voltage at the output of the transistor that is on changes by $\Delta V_O$, the settled voltage at the common source node $V_{CS}$ is changed by a factor $\Delta V_O \cdot g_{ds}/g_m$. The current required to charge and discharge the capacitance $C_S$ is taken from the current source (signal current). It can be shown that this results in third order harmonic distortion for a differential output, as well as second order harmonic distortion for a single ended output. The amount of distortion is a function of output frequency, and the number of segmented bits, among other things.

The previously known methods available to minimize the distortion caused by the parasitic capacitance $C_S$ of the differential pair common source node may be summarized as follows:

1. The capacitance $C_S$ itself can be minimized. This is done by using switches that are as small as possible. The current source is typically implemented as a PMOS cascode current source. By locating the cascode transistor of the current source close to the switch common source node, the parasitic capacitance associated with routing between current source and switch can be minimized. Minimizing the width of the switch transistors $M_1$ and $M_2$ results in a high current density in these transistors, resulting in large gate voltage overdrive. This reduces the voltage drop available for the current sources, reducing the allowable gate voltage overdrive on the current sources. Thus, the sensitivity of the DAC currents to device mismatch is increased, resulting in degraded static linearity. Another way to optimize this is to build the DAC core from NMOS devices instead of PMOS devices. These typically have an advantage due to the higher electron mobility, allowing the designer to make the devices smaller by roughly a factor of 3.

2. The voltage gain of the switch transistors can be optimized. This voltage gain is limited by the $g_m/g_{ds}$ of the switches. If the voltage gain is increased by increasing the channel length, the $C_{GS}$ also increases—hence not much can be gained in terms of distortion using only this method. Selecting a process with high $g_m/g_{ds}$—e.g. a BiCMOS process—using bipolar transistors as data switches, is one way to achieve this.

3. Regulating the cascode of the current source. This enhances the output impedance of the current source. Since the majority of the capacitance $C_S$ is associated with the switch transistors, this does not help third harmonic distortion much, but may be advantageous for static linearity and intermodulation distortion.

4. Bootstrapping the bulk of the switch and cascode transistors. This reduces $C_S$ roughly by a factor of 2 in a typical implementation. The amount of improvement is technology dependent.

DETAILED DESCRIPTION OF THE PREFERRED EMBODIMENTS

The present invention takes a different approach. Rather than minimizing the error, the error is sensed, and an opposite error is added, nulling the original error.

Figure 1:
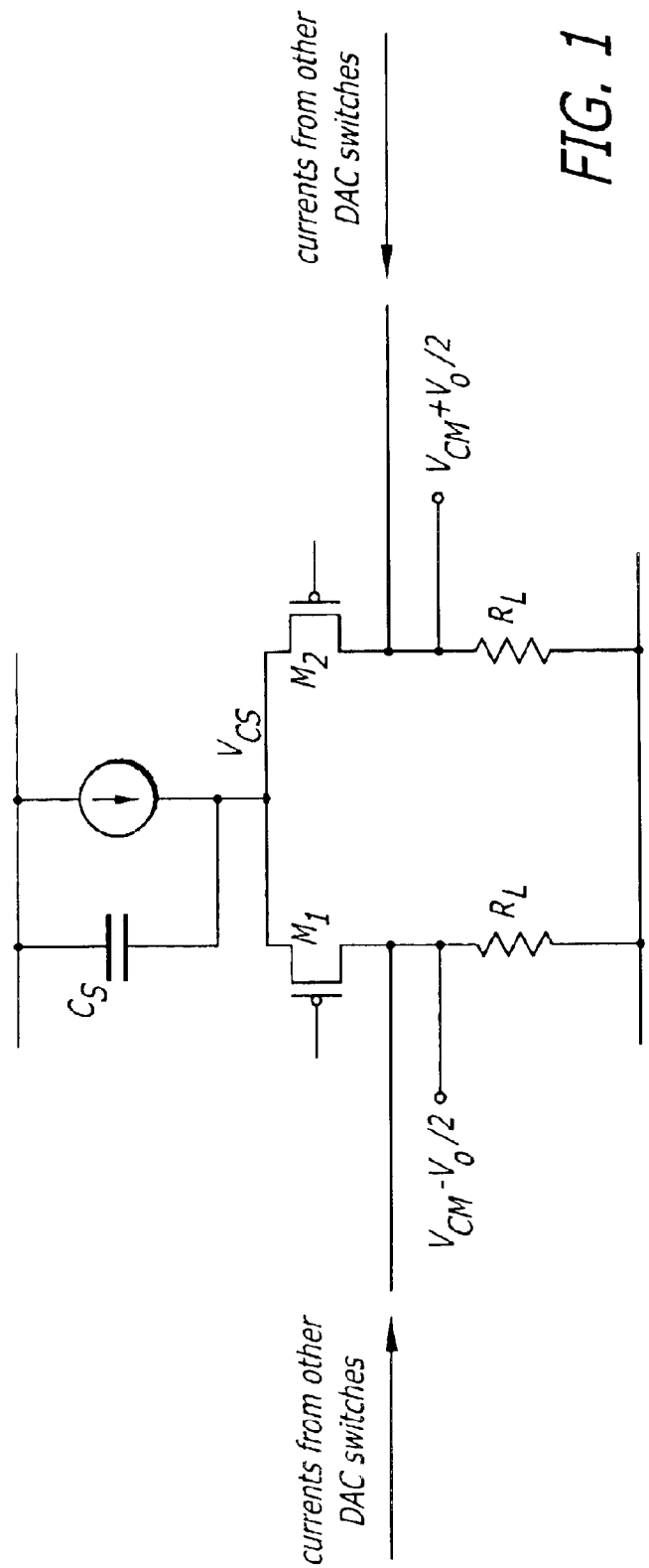
FIG. 1 is a circuit diagram for a conventional current switch in prior art current steering DACs.
Figure 2:
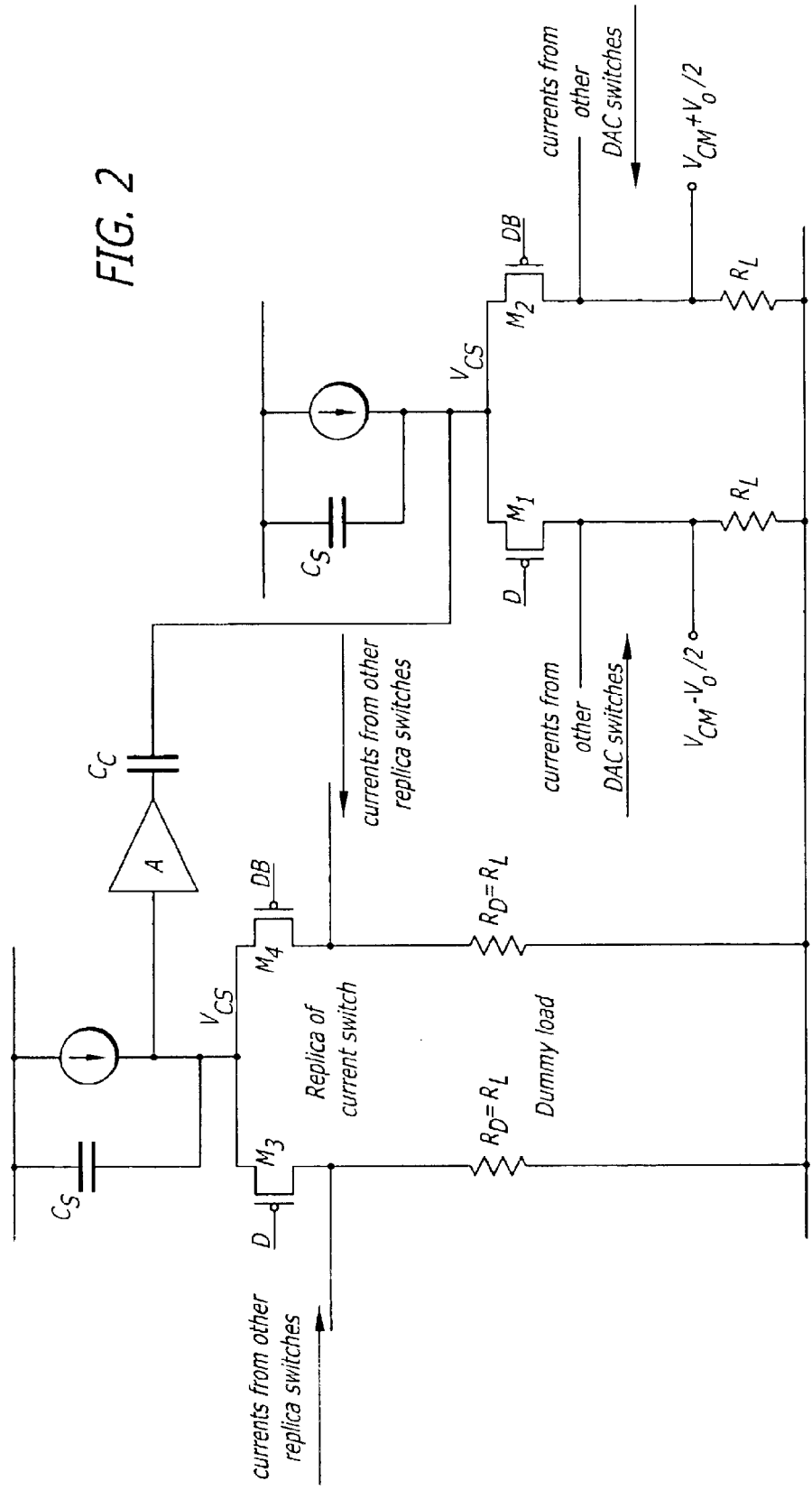
FIG. 2 is a circuit diagram for one embodiment of the present invention.

A circuit diagram is shown in FIG. 2. A capacitor $C_C$ is connected to the common source node of the current switch. The bottom plate of this capacitor is driven by an amplifier A with voltage gain equal to A. The input of amplifier A is driven by the common source node of a replica of the current switch. The replica switch (transistors $M_3$ and $M_4$) has the same current density as the "real" current switch (transistors $M_1$ and $M_2$), hence it has the same error on the common source node. The amplifier thus senses the error at this node, and injects a compensating charge into the common source node of transistors $M_1$ and $M_2$ through the capacitor $C_C$. The capacitor $C_C$ is driven such that it adds back the charge taken from the signal current source to charge $C_S$.

The amount of charge to be added to $C_S$ to compensate the error introduced by this capacitance can be calculated as follows. The change in the output voltage seen by the on-switch from one sample to the next can be called $\Delta v$. The voltage on the switch common source node will change from $V_{CS}$ to $V_{CS}+\Delta v/(g_m/g_{ds})$, where $g_m/g_{ds}$ is the intrinsic gain of the switch transistor. Using the charge equations for the circuit, the charge taken from the current source to charge $C_S$ will be replenished if the voltage gain of the amplifier is:

$$A = \frac{C_S + C_C}{C_C}$$

Hence, for example, if $C_C=C_S$, A=2 is required.

This embodiment may have some limitations. One is that the routing between the current switches and the dummy load needs to go across a large distance, making for a layout challenge. Another problem is that additional accurate current sources are needed for the replica switches (these preferably should be scaled down). Another is that it limits operation of the DAC to a limited range of output impedance for low distortion. If the load impedance of the DAC and the load impedance of the dummy load are different, the charge cancellation will not be complete. This may very well be the case. Typically, one would integrate the dummy load to avoid extra pins for this load, and also to avoid bandwidth reduction caused by ESD structures. The DAC load resistors on the other hand are typically not integrated to maximize the user's flexibility in interfacing with the DAC output. In order to circumvent these limitations, an alternative embodiment is preferred.

Figure 3:
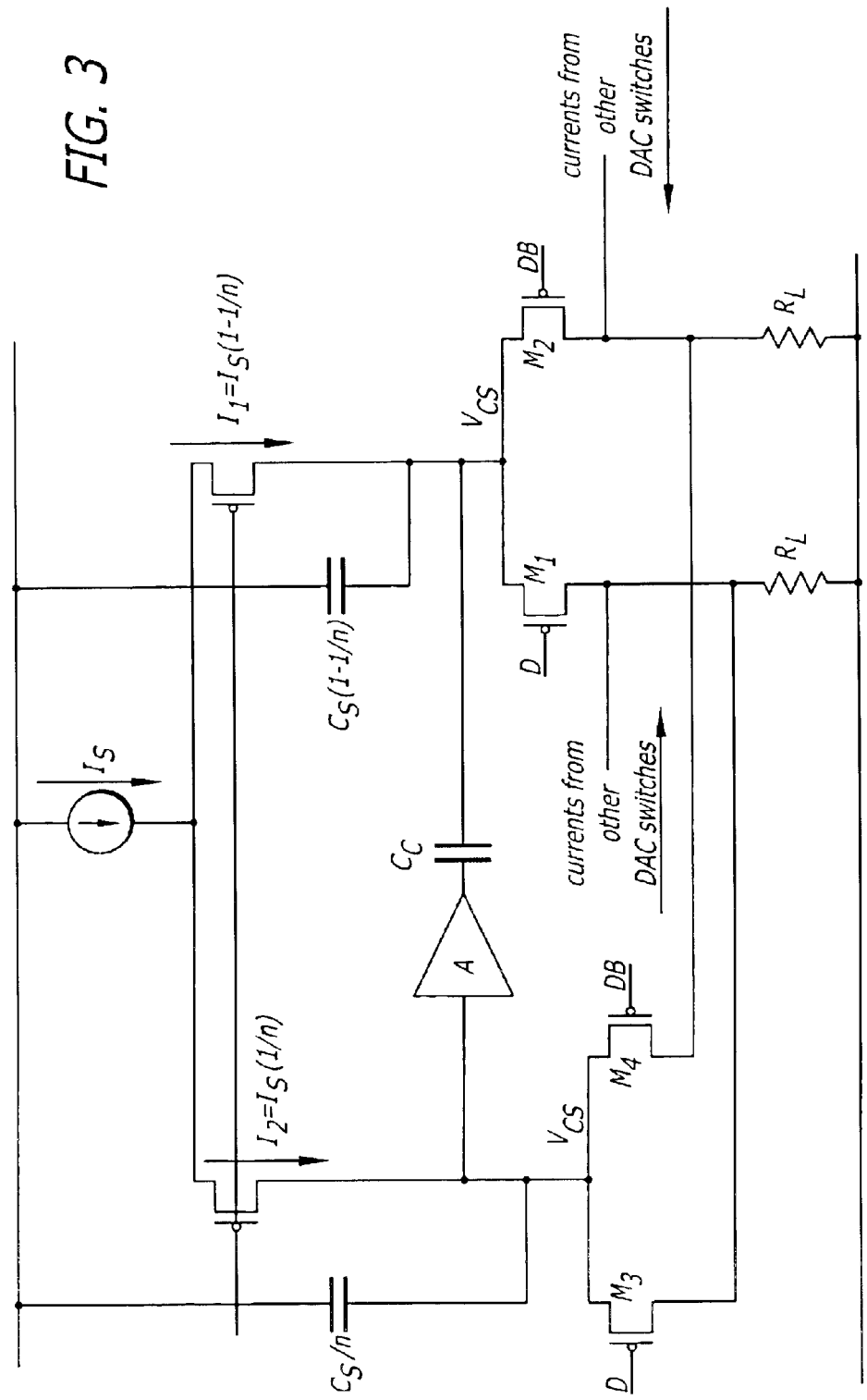
FIG. 3 is a circuit diagram for a preferred embodiment of the present invention.

The preferred embodiment is illustrated in FIG. 3. As shown therein, a current splitter is added in each current source cascode, which already exists as part of each current source. The current of each source is split into two parts, $I_1$ and $I_2$. $I_2$ is scaled down a factor n, where n is a rational number. Typically, n may preferably be larger than 2, and more preferably 4 or more. The remaining current $I_1$ is the main contribution to the signal current. This is scaled a factor (1-1/n). These currents go to two different switches. The main switch consists of transistors $M_1$ and $M_2$. The main switch device width is scaled a factor (1-1/n). The reduced switch consists of transistors $M_3$ and $M_4$. The widths of transistors $M_3$ and $M_4$ are scaled by a factor of (1/n) compared to the size of the original switch transistors $M_1$ and $M_2$. The outputs of the two switches both go to the DAC output. A voltage amplifier with voltage gain=A senses the voltage on the common source node of the reduced or replica switch and injects charge into the common source node of the main switch responsive thereto. In this case, $C_c$ should be chosen a little bit larger than in the case of a dummy switch and dummy loads being used. The reason is that the parasitic capacitance on the common source node of the replica switch (transistors $M_3$, $M_4$) is not being compensated. This can be dealt with by slightly overcompensating the main switch (transistors $M_1$, $M_2$).

In operation, when the output voltage starts to change, $V_{cs}$ for both the primary switch and the replica switch begin to change. The change in voltage of the common source node of the replica switch causes amplifier A to amplify the change, in turn causing capacitor $C_c$ to inject an electronic charge into the common source node of the primary switch proportional to the voltage change of the common source node of the replica switch. As pointed out before, the charge can be proportioned to change the voltage across the capacitance $C_s$ for the primary switch, so that no charge to or from the output is required for this purpose. Slightly increasing the charge for a given change in output voltage $\Delta V$ can offset the charge required to compensate for the required charging of the common source node of the replica switch. Care should be taken, however, to not have the loop gain through the two on switches, amplifier A and capacitor $C_c$, including the loading of the parasitic capacitors $C_s$, exceed unity for stability reasons. In a multistage thermometer coded DAC, the present invention may be implemented in all stages, or alternatively, in the most significant bit stage only.

Figure 4:
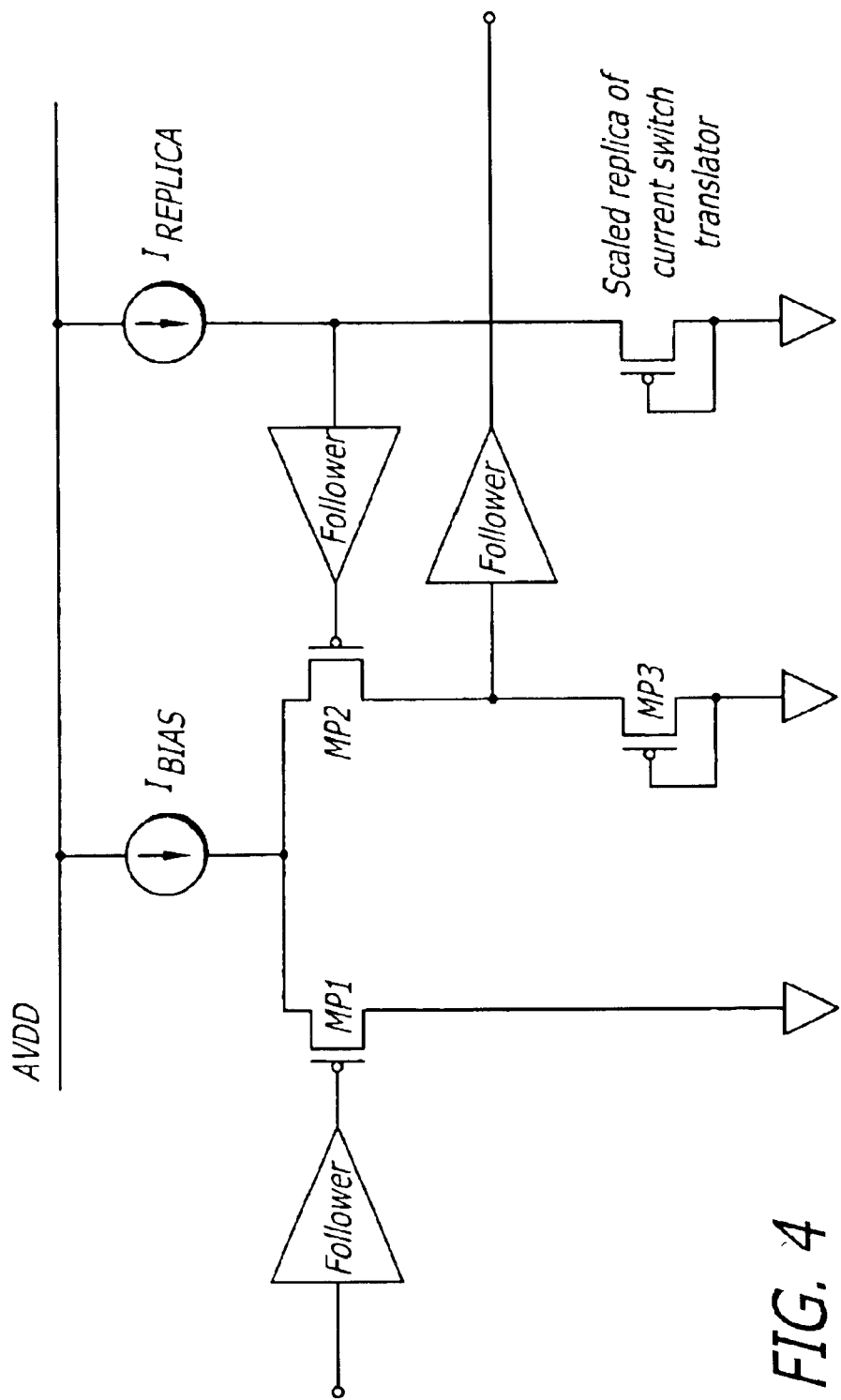
FIG. 4 is an exemplary embodiment of the amplifier A of the embodiments of FIGS. 2 and 3.

The buffer amplifier A used for the compensation should have a fast settling step response such that the output settles before the end of the clock cycle. This means a wide bandwidth. It is also important to have good supply rejection, and that the output be referenced to the same ground as the switch driver. Furthermore, the input of the buffer should have a low capacitance. A buffer implementation satisfying these requirements is shown in FIG. 4. Unity gain buffers (followers) are used at the amplifier input to reduce input capacitance and for level shifting. The ratio of $g_{m(MP1)}/g_{m(MP3)}$ is used to set gain. In one embodiment, a bandwidth of approximately 1 GHz was found to be sufficient for a 500 MHz DAC update rate. To maximize bandwidth, it is important that the current source $I_{BIAS}$ is cascoded to have low output capacitance.

Frequently in MOS circuits, the bodies or bulk of the transistors are each connected to the respective transistor source. However, this is not a limitation in the present invention, as the bodies of the transistors may be connected to another voltage, if desired, provided there is ample protection against forward biasing the inherent body diodes during normal operation. Also, while MOS transistors are preferred, other types of transistors, such as bipolar transistors, may be used if desired.

While certain preferred embodiments of the present invention have been disclosed herein, such disclosure is only for purposes of understanding the exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A method of reducing distortion in a current steering DAC having a plurality of current steering switches, each current steering switch having first and second transistors with a common node coupled to a first current source, the method comprising, for each current steering switch:
   providing a replica of the current steering switch, the replica switch having third and fourth transistors with a common node coupled to a second current source;
   sensing the voltage variation on the common node of the replica of the current steering switch;
   injecting charge onto the common node of the current steering switch responsive to the voltage variation on the common node on the replica of the current steering switch.

2. The method of claim 1 wherein the charge injected onto the common node of the current steering switch is proportional to the voltage variation on the common node on the replica of the current steering switch.

3. The method of claim 2 wherein the charge is injected by amplifying the voltage variation on the common node on the replica of the current steering switch, and coupling the amplified voltage variation to the common node of the current steering switch through a coupling capacitor.

4. The method of claim 3 wherein the voltage variation on the common node on the replica of the current steering switch is amplified by a gain approximately equal to $(C_S + C_C)/C_C$, where $C_S$ is the capacitance associated with the common node of the current steering switch and $C_C$ is the capacitance of the coupling capacitor.

5. The method of claim 1 wherein the charge injected onto the common node of the current steering switch is approximately equal to the charge needed to change the voltage on a capacitance associated with the common node of the current steering switch by an amount equal to the change in voltage of an output of the current steering switch divided by the intrinsic gain of the switch transistor.

6. The method of claim 1 wherein each of the first and second transistors is terminated in a respective DAC load, and the third and fourth transistors are each terminated in a respective replica switch load.

7. The method of claim 1 wherein each of the first and second transistors is terminated in a respective DAC load, and the third and fourth transistors are each also terminated in a respective one of the DAC loads.

8. The method of claim 7 wherein the ratio of the size of the first and second transistors to the size of the third and fourth transistors is n, where n is larger than 1, and the ratio of the first current source to the second current source is also n.

9. The method of claim 8 wherein the first and second current sources comprise a current splitter.

10. The method of claim 1 wherein the ratio of the size of the first and second transistors to the size of the third and fourth transistors is n, where n is larger than 1, and the ratio of the first current source to the second current source is also n.

11. The method of claim 10 wherein the first and second current sources comprise a current splitter.

12. The method of claim 1 wherein the current steering switch and the replica switch comprise transistor switches selected from the group consisting of MOS transistors, MESFET transistors, HEMT transistors, JFET transistors and bipolar junction transistors.

13. The method of claim 1 wherein the current steering switch and the replica switch are CMOS switches, and wherein the body of each CMOS switch is connected to its source.

14. The method of claim 1 wherein the current steering switch and the replica switch are CMOS switches, and wherein the body of each CMOS switch is connected to a voltage other than its source.

15. A method of reducing third harmonic distortion in a current steering DAC having a plurality of current steering switches, each current steering switch having first and second transistors with a common node, each of the first and second transistors being terminated in a respective DAC load, the method comprising, for each current steering switch:

splitting a steering current to provide first and second current sources, the first current source being coupled to the common node of the first and second transistors, the first current source being n times the second current source, wherein n is larger than 1;

providing a replica of the current steering switch, the replica switch having third and fourth transistors with a common node coupled to the second current source, each of the third and fourth transistors also being terminated in a respective DAC load, each of the third and fourth transistors being switched in unison with a respective one of the first and second transistors, the first and second transistors being larger than the third and fourth transistors by the factor n;

sensing the voltage variation on the common node of the replica of the current steering switch;

injecting charge onto the common node of the current steering switch responsive to the voltage variation on the common node on the replica of the current steering switch.

16. The method of claim 15 wherein the charge injected onto the common node of the current steering switch is proportional to the voltage variation on the common node on the replica of the current steering switch.

17. The method of claim 16 wherein the charge is injected by amplifying the voltage variation on the common node on the replica of the current steering switch, and coupling the amplified voltage variation to the common node of the current steering switch through a coupling capacitor.

18. The method of claim 17 wherein the voltage variation on the common node on the replica of the current steering switch is amplified by a gain approximately equal to $(C_S+C_C)/C_C$, where $C_S$ is the capacitance associated with the common node of the current steering switch and $C_C$ is the capacitance of the coupling capacitor.

19. The method of claim 15 wherein the charge injected onto the common node of the current steering switch is approximately equal to the charge needed to change the voltage on a capacitance associated with the common node of the current steering switch by an amount equal to the change in voltage of an output of the current steering switch divided by the intrinsic gain of the switch transistor.

20. The method of claim 15 wherein the current steering switches and the replica switches comprise transistor switches selected from the group consisting of MOS transistors, MESFET transistors, HEMT transistors, JFET transistors and bipolar junction transistors.

21. The method of claim 15 wherein the current steering switches and the replica switches are CMOS switches, and wherein the body of each CMOS switch is connected to its source.

22. The method of claim 15 wherein the current steering switches and the replica switches are CMOS switches, and wherein the body of each CMOS switch is connected to a voltage other than its source.

23. A current steering DAC comprising a plurality of controllable current sources, each current source comprising:

a first current switch having first and second transistors with a common node coupled to a first current source, the transistors each being coupled to a respective one of first and second DAC loads and each having a control terminal for steering the current of the first current source to the first or the second DAC load responsive to a differential signal applied to the control terminals of the first and second transistors;

a second current switch having third and fourth transistors with a common node coupled to a second current source, the third and fourth transistors each being coupled to a respective one of the first and second DAC loads and each having a control terminal for steering the current of the second current source to the first or the second DAC load responsive to the differential signal as also applied to the control terminals of the third and fourth transistors; and, a charge injection circuit injecting a charge into the common node of the first and second transistors responsive to the change in voltage of the common node of the third and fourth transistors.

24. The current steering DAC of claim 23 wherein the charge injection circuit is a circuit for injecting a charge proportional to the voltage variation on the common node of the third and fourth transistors.

25. The current steering DAC of claim 24 wherein the injection circuit is comprised of an amplifier coupled to amplify the voltage change on the common node of the third and fourth transistors and a capacitance coupled between an output of the amplifier and the common node of the first and second transistors.

26. The current steering DAC of claim 25 wherein the capacitance and the gain of the amplifier are selected so that the gain of the amplifier is approximately equal to $(C_S+C_C)/C_C$, where $C_S$ is the capacitance associated with the common node of the first and second transistors and $C_C$ is the capacitance of the coupling capacitor.

27. The current steering DAC of claim 23 wherein the first, second, third and fourth transistors comprise a type of transistor selected from the group consisting of MOS transistors, MESFET transistors, HEMT transistors, JFET transistors and bipolar junction transistors.

28. The current steering DAC of claim 23 wherein the first, second, third and fourth transistors are CMOS transistors having a source, drain and gate, and wherein the body of each CMOS transistor is connected to its source.

29. The current steering DAC of claim 23 wherein the first, second, third and fourth transistors are CMOS transistors having a source, drain and gate, and wherein the body of each CMOS transistor is connected to a voltage other than its source.

* * * * *